United States Patent [19]
Pascucci et al.

[11] Patent Number: 5,831,891
[45] Date of Patent: Nov. 3, 1998

[54] NON-VOLATILE MEMORY DEVICE HAVING OPTIMIZED MANAGEMENT OF DATA TRANSMISSION LINES

[75] Inventors: Luigi Pascucci, Sesto San Giovanni; Antonio Barcella, Trescore Balneario, both of Italy

[73] Assignee: STMicroelectronics S.r.l., Agrate Brianza, Italy

[21] Appl. No.: 812,595

[22] Filed: Mar. 7, 1997

[30] Foreign Application Priority Data

Mar. 20, 1996 [EP] European Pat. Off. ............. 96830128

[51] Int. Cl.[6] .................................................. G11C 5/06
[52] U.S. Cl. ................................................. 365/63; 365/51
[58] Field of Search ....................... 365/51, 63; 395/287, 395/308

[56] References Cited

U.S. PATENT DOCUMENTS

| | | | |
|---|---|---|---|
| 5,150,467 | 9/1992 | Hayes et al. ......................... | 395/287 |
| 5,367,480 | 11/1994 | Matsumiya ............................. | 365/63 |
| 5,369,611 | 11/1994 | Miura ..................................... | 365/189 |
| 5,584,010 | 12/1996 | Kawai et al. ........................... | 395/444 |
| 5,619,466 | 4/1997 | McClure ................................. | 365/207 |
| 5,633,822 | 5/1997 | Campardo et al. ................ | 365/185.02 |
| 5,646,891 | 7/1997 | Okamoto ........................... | 365/185.22 |

Primary Examiner—David C. Nelms
Assistant Examiner—Hoai V. Ho
Attorney, Agent, or Firm—Wolf, Greenfield & Sacks, P.C.

[57] ABSTRACT

A non-volatile memory device having optimized management of data transmission lines, having the particularity that it comprises at least one bidirectional internal bus that runs from one end of the memory device to the other, one or more source structures that exist externally and internally to the memory device, and a timer means. The timer means is adapted to time-control the independent and exclusive access of the external and internal source structures, within a same memory cycle, to the internal bus for the transmission of data, controls, and functions, from one end of the memory to the other over the internal bus.

38 Claims, 4 Drawing Sheets

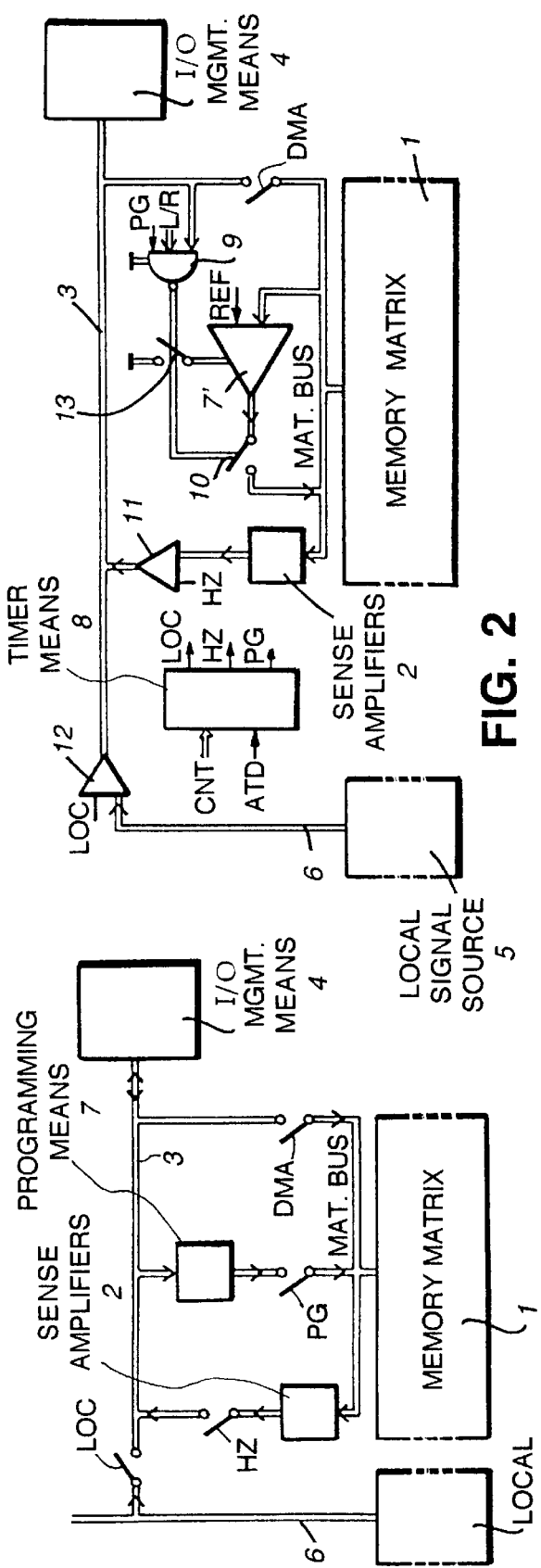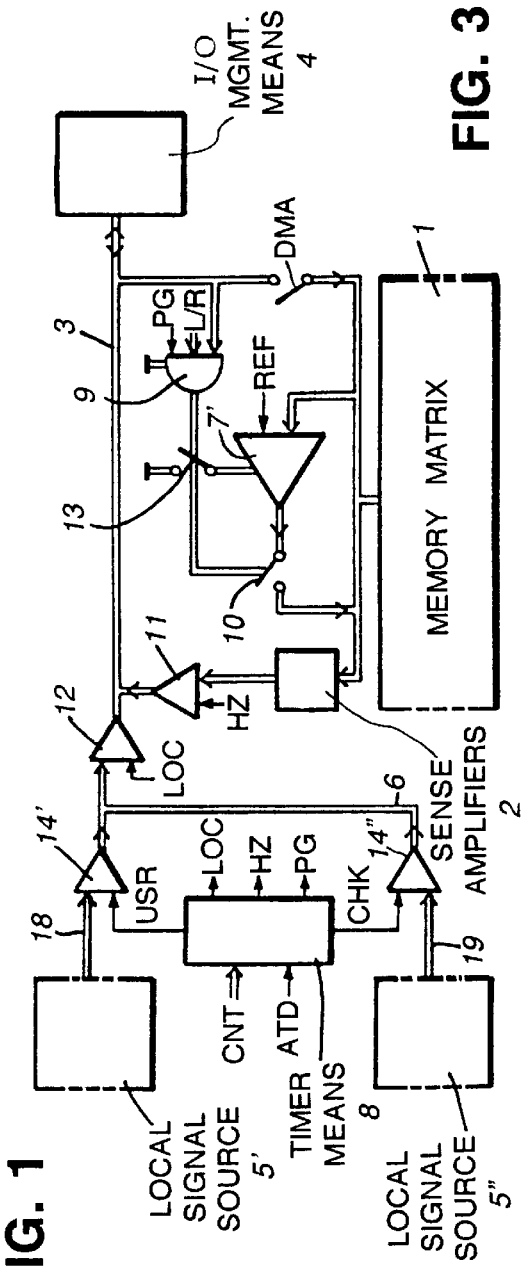

NON-VOLATILE MEMORY DEVICE HAVING OPTIMIZED MANAGEMENT OF DATA TRANSMISSION LINES

BACKGROUND OF THE INVENTION

1. Field of the Invention

The present invention relates to a non-volatile memory device having optimized management of data transmission lines.

2. Discussion of the Related Art

As the complexity and size of non-volatile memories gradually increase, it is increasingly important to be able to rationalize the data exchange lines of the system.

This requirement is due to the need to sort the streams of data, controls, and functions, to facilitate better inspectability of the memory, to implement analysis possibilities in order to improve reliability, and finally to reduce the space occupation of the memory device.

Transmission of the data acquired from the memory matrix for reading and sending to the output terminals occurs by means of dedicated lines. Likewise, transmission of data that indicates the state of the memory, events in progress, and test data requires auxiliary lines that run from one end to the other of the memory device, depending on the placement of the external and internal sources from which data and information must be acquired.

In this manner, in view of the ever-growing demand for information regarding the operation of the memory, which must thus be sent out, several additional lines are required. These lines are provided in addition to the data transmission lines of the memory, and increase the area that is physically occupied by the memory device and complicate its management.

SUMMARY OF THE INVENTION

One aim of the present invention is therefore to provide a non-volatile memory device whose architecture allows a reduction in the number of connecting lines for data transfer.

Within the scope of this aim, an object of the present invention is to provide a non-volatile memory device that allows bidirectional data transfer from the memory to the outside world and vice versa.

Another object of the present invention is to provide a non-volatile memory device whose architecture allows an improvement in the number of external structures or points that can be directly inspected from outside in order to improve its monitoring.

Another object of the present invention is to provide a non-volatile memory device that allows standardization and synchronization of the data streams.

Another object of the present invention is to provide a non-volatile memory device whose architecture facilitates fault searching and analysis activities and expands their potential.

Another object of the present invention is to provide a non-volatile memory device whose architecture allows improvement in performance as a consequence of a reduction in the loads caused by connecting lines.

Another object of the present invention is to provide a non-volatile memory device that is highly reliable and relatively easy to manufacture at competitive costs.

This aim, these objects, and others which will become apparent hereinafter are achieved by a non-volatile memory device having optimized management of data transmission lines. The device comprises at least one bidirectional internal bus that runs from one end of the memory device to the other, one or more source structures that lie externally and internally to the memory device, and timer means. The timer means is adapted to time-control the independent and exclusive access of the external and internal source structures, within the same memory cycle, to the internal bus for the transmission of data, controls, and functions, from one end of the memory to the other over the internal bus.

This aim and the above mentioned objects are also achieved by a method for transmitting signals in a memory device provided with at least one bidirectional internal bus, with one or more external and internal sources that are adapted to access the internal bus, and with timer means, the method including the following steps:

1) detecting an address change signal of the memory;
2) allowing the mutually exclusive access of each one of the external and internal source structures to the bidirectional internal bus, during a step of the normal memory reading cycle in which the data of the memory are not yet preset for reading, wherein the external and internal source structures transmit data on the internal bus; and
3) disabling the access of the external and internal source structures to the data bus to enable the reading of data of the memory within the same reading cycle of the memory.

BRIEF DESCRIPTION OF THE DRAWINGS

Further characteristics and advantages of the invention will become apparent from the description of a preferred, but not exclusive, embodiment of the device according to the invention, illustrated only by way of a non-limiting example in the accompanying drawings, wherein:

FIG. 1 is a general block diagram of the architecture of the memory device according to the present invention;

FIG. 2 is a more detailed block diagram of the architecture of the memory device shown in FIG. 1;

FIG. 3 is an even more detailed block diagram of the architecture of the memory device shown in FIG. 1;

DETAILED DESCRIPTION

Figure 4:
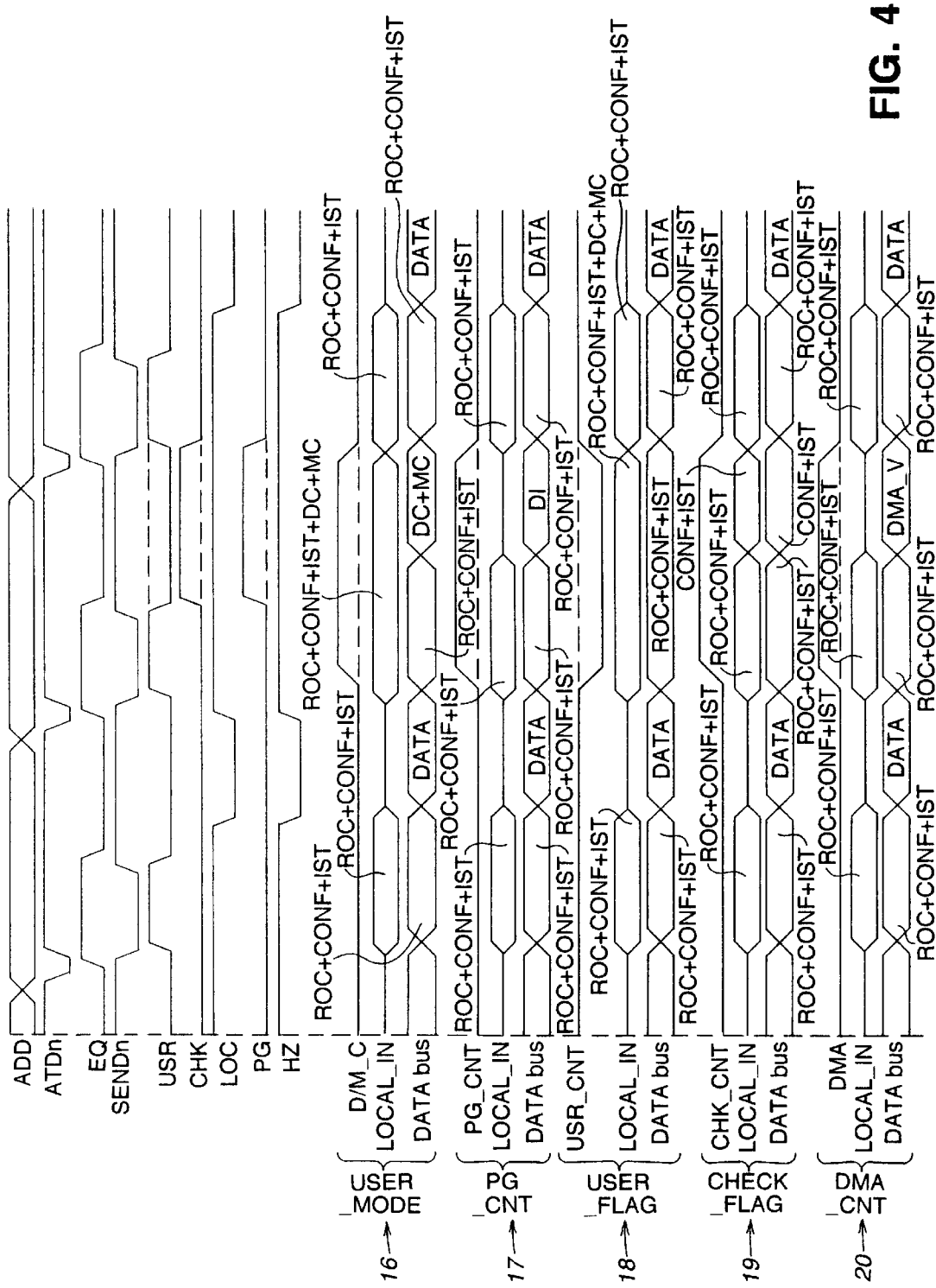
FIG. 4 is a diagram of the timings of the various signals that are present in the memory device according to the invention.

With reference to FIG. 1, the memory device according to the present invention comprises a memory matrix 1, with which an internal bus 3, hereinafter termed data bus, is associated. The data bus 3 branches off, proximate to the memory matrix, into a bus that is designated by MAT-bus in the figure and connects the memory matrix to the sense amplifiers, which are generally designated by the reference numeral 2 in the figure.

The data bus 3 allows connection between one end of the memory device and the other, i.e., between input/output (I/O) management means 4 and local signal sources 5. In FIG. 1, a single local signal source 5 is shown generically.

The data bus 3 has characteristics that allow bidirectionality of data transmission between the input/output management means 4 and the memory matrix 1.

The local signal sources 5 are interfaced with the data bus 3 by means of a local bus 6.

A plurality of structures described hereinafter are interfaced with the data bus.

Thus, the sense amplifiers 2, for transferring the data from the matrix I to the bus 3, communicate with the data bus by closing a switch designated by HZ in FIG. 1.

Programming means 7, adapted to program the non-volatile memory matrix 1, are enabled/disabled by opening/closing a switch, designated in the figure by PG, for connection between the data bus 3 and the memory matrix 1 across the programming means 7.

Furthermore, a connecting path between the data bus 3 and the memory matrix 1, used to perform direct memory access (DMA) tests, is provided by closing a switch designated by DMA.

Finally, the connection between the local signal sources 5, with the corresponding local bus 6, and the data bus 3 is provided by closing a switch designated by LOC.

FIG. 2 is a more detailed view of the architecture of the memory device shown in FIG. 1.

In particular, the figure shows timer means 8, which receives as input the ATD signal (Address Transition Detection) for detecting an address change in the memory, and a bus, referenced by CNT, that carries device control signals.

The timer means is adapted to generate the signals that drive the switches HZ, PG, and LOC described above. These signals are referenced with the same designations, HZ, PG, and LOC, for the sake of convenience in the description.

The programming means generally designated by the reference numeral 7 in FIG. 1 is now split into various components.

The connecting path between the bus 3 and the programming means 7 is constituted by a branching of the bus 3 which, through a NAND logic gate 9, reaches a switch 10 that enables connection to the matrix bus MAT-bus.

In FIG. 2 (and in FIG. 3), the reference numeral 7 is replaced by the reference sign 7', which identifies an adjustment means for programming.

The NAND logic gate 9 receives as input, in addition to the data bus 3 (and therefore signals that arrive from the input/output management means 4), the programming signal PG generated by the timer means 8 and an additional data bus, termed L/R, which transmits information concerning the portion of the memory matrix I that is affected by programming.

Finally, the NAND gate 9 is connected to the ground.

The adjustment means 7' receives as an input the matrix bus MAT-bus and a reference signal REF, and is in turn connected to the ground at one end (by means of a switch 13) and to the matrix bus MAT-bus and an output at its other end, by means of a switch 10.

In practice, the reference numeral 7 of FIG. 1 comprises the reference signs 7', 9, and 13.

The sense amplifiers 2 are connected, as shown in FIG. 2, between the matrix bus MAT-bus (which is a branch of the data bus) and the data bus 3, for access to the data bus, by virtue of the enabling/disabling means generally designated by HZ in FIG. 1 and shown in this successive figure as a circuit of the tristate type 11.

The tristate circuit 11, which is particularly adapted for driving highly capacitive lines, receives as input the matrix bus MAT-bus and the signal HZ for enabling/disabling the read path between the sense amplifiers 2 and the data bus 3.

Likewise, the switch shown in FIG. 1 and designated by LOC is shown in detail in figure 2 as a means for enabling/disabling the access of the local signal source 5 to the data bus 3. These means are provided by means of a circuit 12 of the tristate type, which is particularly adapted to drive highly capacitive lines and receives as input the local bus 6 and the signal LOC for enabling/disabling the path between the local signal source 5 and the data bus 3. As already explained, the signal LOC is generated by the timer means 8.

FIG. 3 is a view of the same memory architecture of FIGS. 1 and 2 described above, in the case in which there is a plurality of local signal sources 5' and 5" that require access to the data bus 3. For the sake of simplicity in illustration, only two local sources 5' and 5" have been shown.

In this case, each local signal source 5 has access to the local bus 6 (which becomes a bus that is shared by a plurality of local signal sources 5) by virtue of access enabling/disabling means, which are constituted by circuits 14 of the tristate type that interface each local signal source 5 with the local bus 6 for the transit of the data over the data bus 3, as shown earlier.

In FIG. 3, the timer means 8 emits two signals, termed USR and CHK, which are meant for the sequential timing of the access to the bus 3 of the two local signal sources 5 respectively. In the continuation of the description, in order to distinguish between the two local signal sources they will be designated by 5' and 5".

Therefore, the signal USR for enabling access to the data bus 3 for the local signal source 5" is fed into the tristate circuit 14' (related to the local source 5'), whereas the signal CHK for enabling access to the data bus 3 for the local signal source 5" is fed into the tristate circuit 14" (related to the local source 5"). Both signals USR and CHK also constitute inputs for additional enabling/disabling means that are advantageously constituted by a tristate circuit, shown in FIG. 9, whose output constitutes an input for the tristate circuit 12 for access to the data bus 3.

The actual number of tristate circuits 12 is equal to the number of data lines of the data bus FIG. 4 is a diagram of the timings of the various signals that are present in the memory device according to the invention.

The signals are listed below to clarify their meaning. The explanation of FIG. 4 will be presented later, with the explanation of the operation of the memory device.

Therefore, the signals are:

ADD: memory address signal;

ATD: address transition detection signal (the inverted ATD signal, ATDn, is shown in the figures);

EQ: equalization signal;

SEND: timing signal (the inverted SEND signal, SENDn, is shown in the figures) for sending data of the local signal source 5" in a "cyclic" manner and for simultaneously blocking the data of the local signal source 5", again in a cyclic manner;

USR: signal for enabling/disabling the path from the local signal source 5' to the data bus 3;

CHK: signal for enabling/disabling the path from the local signal source 5" to the data bus LOC: signal for enabling/disabling the access of the local signal sources 5' and 5" to the data bus 3;

PG: signal for enabling the programming circuits;

DMA: signal for enabling/disabling the path for direct access to the memory matrix 1.

These signals, which belong to the memory device, are complemented by signals that are characteristic of the local signal sources 5' and 5".

The signals can be grouped into special function signals, generally designated by the reference numeral 16; programming control signals, generally designated by the reference numeral 17; user indication signals 18; control indication signals 19; and DMA control signals 20.

In particular, the following signals are provided:

DC/MC-CODE: device code and manufacturer code signals;

LOCAL-IN: signals of local input sources;

PG-CNT: programming control signal;

USR-CNT: control signal for the local signal source 5', during memory device inspections;

CHK-CNT: control signal for the local signal source 5" at the end of the signal SENDn;

DMA: direct memory access signal;

DATA-bus: signal for transmission of data on data bus 3;

DI: signal for input of data from programming;

ROC: redundancy activity signals (Redundancy Out Code);

CONF: memory configuration signals; and

IST: instruction signals.

FIGS. 5 to 12 are circuit diagrams that show in detail the circuits that provide the memory architecture shown in particular in FIG. 3, and generally in FIGS. 1 and 2.

The signals PG-CNT, USRn-CNT and CHK-CNT, passed through appropriate logic gates, shown with respect to the description of the figures that follow, produce the signals PG, LOC, HZ, USR, and CHK, which constitute the outputs of the timer means 8.

These signals are stimulated in an exclusive manner.

The bus CNT input to the timer means carries the signals USRn-CNT, CHK-CNT, and PG-CNT.

Figure 5:
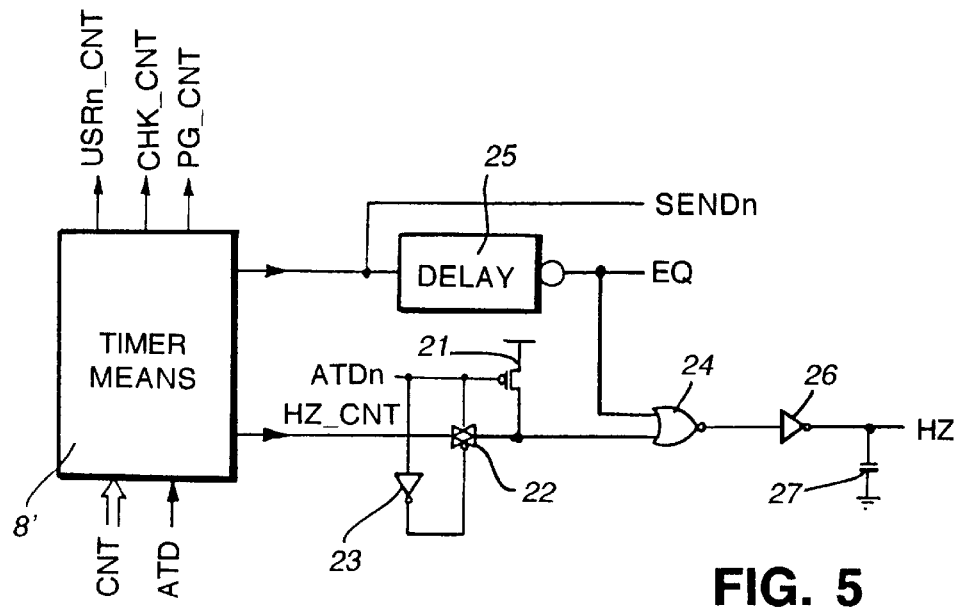
FIG. 5 is a circuit diagram of a portion of the architecture of the memory device according to the invention, shown in FIGS. 1 to 3.

In particular FIG. 5 shows detail circuitry interacting with the timer means 8. The reference numeral 8' designates the timer means, which differs from the timer means 8 of the preceding figures merely in that the block designated by the reference numeral 8 in FIGS. 1 and 2 also comprises the circuits shown in FIGS. 6, 7, 8, and 9. These circuits generate the signals USR (and USRn) and CHK (and CHKn). Therefore, in practice, the timer means 8, generally shown in FIGS. 5 to 9, is considered as a whole.

FIG. 5 is a detailed view of the circuit for generating the signals SENDn, EQ. and HZ. The signal HZ-CNT, together with the signal ATDn, is emitted by the timer means 8'. The signal ATDn is fed to the base of a first P-type transistor 21, whose drain terminal is connected to the supply voltage and whose source terminal is connected to the output terminal of a pass transistor 22, which is constituted by a P-type transistor and by an N-type transistor, whose input terminal receives the signal HZ-CNT.

The signal ATDn is also sent as input to a first inverter 23, whose inverted output (ATD) is sent to the gate terminal of the P-type transistor of the pass transistor 22 and to the gate terminal of the N-type transistor of the pass transistor 22.

The signal output from the pass transistor 22 (i.e., HZ-CNT) is sent to a NOR logic gate 24 that has two inputs. The second input of the NOR gate 24 is constituted by the signal EQ (equalization, i.e., capture of the data item from the memory matrix I for reading) as output from delay means 25 that receives as input the signal SENDn.

The delay means 25 is required to prevent simultaneous access to the data bus 3 by the local signal sources $5_i$ and by the sense amplifiers 2.

The signal output from the NOR logic gate 24 is inverted in a second inverter 26 to obtain the signal HZ. The output of the inverter 26 is connected to the ground by means of a capacitor 27.

Figure 6:
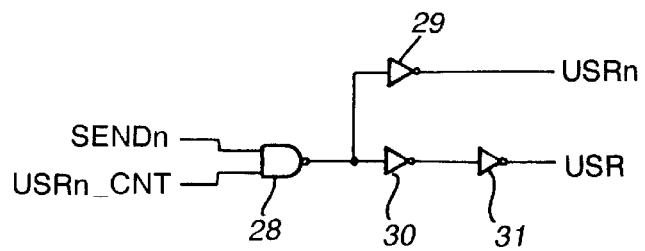
FIG. 6 is a circuit diagram of a portion of the architecture of the memory device according to the invention, shown in FIGS. 1 to 3.

FIG. 6 shows the generation of the signals USRn and USR starting from the SENDn and USRn-CNT signals emitted by the timer means 8'.

In detail, the signals SENDn and USRn-CNT arriving from the timer means 8' are input to a NAND logic gate 28, whose output is sent to an inverter 29 to obtain the signal USRn and to two cascade-connected inverters 30 and 31 to obtain the signal USR.

The signal SENDn is cyclic and allows sending the data over the internal bus 3 during the inactive period of the bus.

Figure 7:
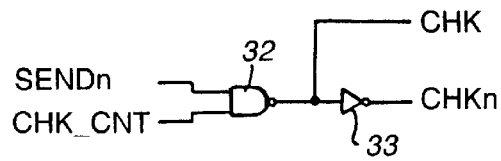
FIG. 7 is a circuit diagram of a portion of the architecture of the memory device according to the invention, shown in FIGS. 1 to 3.

FIG. 7 is a detail view of the generation of signals CHK and CHKn starting from the signals SENDn and CHK-CNT that arrive from the timer means 8'.

In detail, the signals SENDn and CHK-CNT are input to a NAND logic gate 32, whose output is constituted by the signals CHK and, after appropriate inverting through an inverter 33, CHKn.

Figure 8:
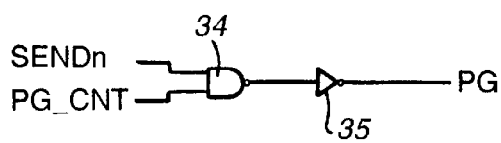
FIG. 8 is a circuit diagram of a portion of the architecture of the memory device according to the invention, shown in FIGS. 1 to 3.

FIG. 8 shows the generation of the programming signal PG starting from the signals SENDn and PG-CNT, which originate from the timer means 8'.

In detail, the signals SENDn and PG-CNT constitute the inputs of a NAND logic gate 34 whose output, appropriately inverted by means of an inverter 35, is the signal PG.

Figure 9:
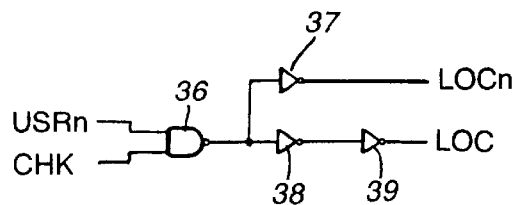
FIG. 9 is a circuit diagram of a portion of the architecture of the memory device according to the invention, shown in FIGS. 1 to 3.

FIG. 9 is a view of the generation of the signals LOCn and LOC starting from the signals USRn and CHK, generated respectively by the circuit of FIG. 6 and by the circuit of FIG. 7.

The signals USRn and CHK constitute the inputs of a NAND logic gate 36, whose output, appropriately inverted by means of an inverter 37, is the signal LOCn and, inverted twice by means of the cascade-connected inverters 38 and 39, is the signal LOC.

The circuits shown in FIGS. 6 to 9 are therefore circuits for driving the circuits shown in the following FIGS. 10–12, whose inputs are the signals generated by the circuits of FIGS. 6 to 9.

Figure 10:
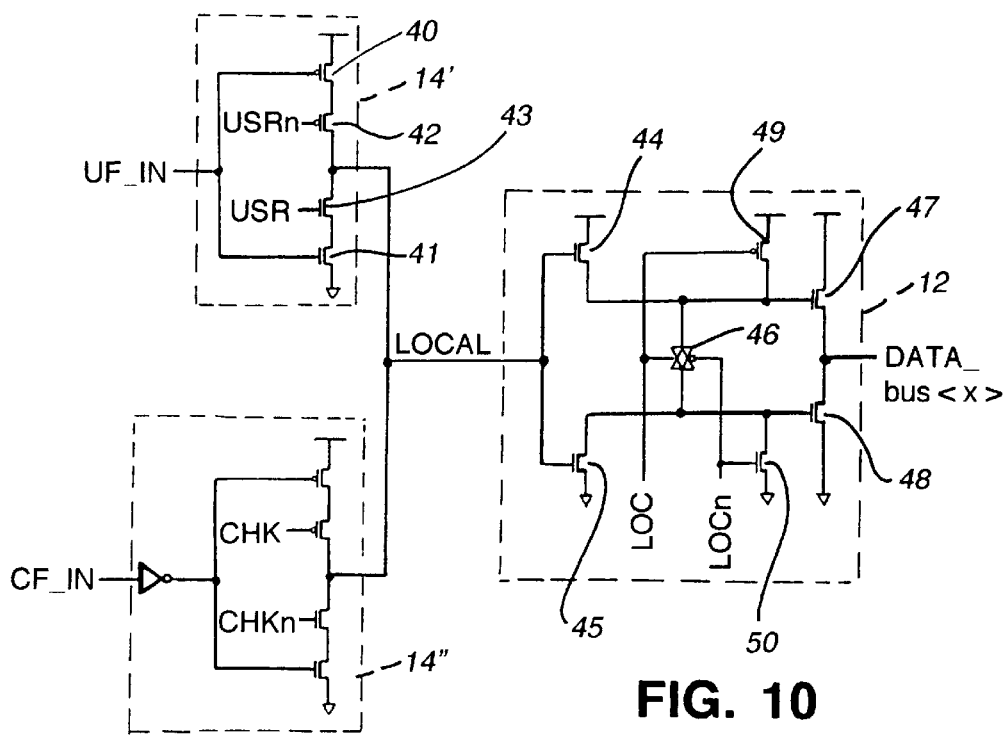
FIG. 10 is a circuit diagram of a portion of the architecture of the memory device according to the invention, shown in FIGS. 1 to 3.

FIG. 10 shows the tristates 14' and 14" that enable access to the tristate 12 to finally gain access to the data bus 3.

In detail, the tristates 14' and 14" have a similar structure, and the elements that compose the respective tristate circuits are therefore described and designated herein by the reference numerals only once to avoid redundancy in the description.

With reference to the tristate circuit 14', the signal UF-IN shown in FIG. 10 as input to the gate terminals of P-type and N-type transistors, respectively 40 and 41, is a signal that originates from the local signal source 5' and is designated by the reference numeral 18 in FIGS. 3 and 4.

Likewise, with reference to the tristate circuit 14", the signal CF-IN shown in FIG. 10 is input to the gate terminals of transistors that are similar to the P-type and N-type transistors 40 and 41. This is a signal that originates from the local signal source 5", and in FIGS. 3 and 4 is designated by the reference numeral 19. The signal CF-IN, before being fed into the gate terminals of the transistors, is first inverted by an inverter.

The drain terminals of the transistor 40 and the source terminals of the transistor 41 are respectively connected to the supply voltage and to the ground.

The tristate structure 14" (and therefore, likewise, the structure 14") also comprises two other transistors 42 and 43, respectively of the P type and of the N type. The drain terminal of the transistor 42 is connected to the source terminal of the transistor 40, and its source terminal is connected to the drain terminal of the transistor 43.

The signals USR and USRn that originate from the circuits shown in FIG. 6 are fed to the gate terminals of the transistors 41 and 42, respectively.

Likewise, the signals CHKn and CHK generated by the circuit shown in FIG. 7 are fed respectively to the gate terminals of the transistors of the tristate structure 14" that correspond to the transistors 41 and 42.

The output signal of the two tristate structures 14' and 14", labeled as LOCAL, is fed to the tristate structure 12 for access to the data bus 3.

The tristate structure 12 comprises two transistors 44 and 45, of the P type and of the N type respectively, whose gate terminals receive the LOCAL signal in input. The drain terminal of the transistor 44 is connected to the supply voltage, the source terminal of the transistor is connected to a pass transistor 46 formed by a P-type transistor and by an N-type transistor and to the gate terminal of a P-type transistor 47. P-type transistors 47 drain terminal is connected to the supply voltage, whereas its source terminal is connected to the drain terminal of a transistor 48.

The source terminal of the transistor 48 is connected to the ground and its gate terminal is connected to the drain terminal of the transistor 45.

The drain terminal of the transistor 45 is also connected to the pass transistor 46.

Signals LOC and LOCn, generated by the circuit shown in FIG. 9, are fed respectively to the gate terminals of transistors 49, of the P type, and 50, of the N type, whose drain terminals are respectively connected to the supply voltage and to the gate terminal of the transistor 48.

The source terminal of the transistor 49 is connected to the gate terminal of the transistor 47, whereas the source terminal of the transistor 50 is connected to the ground.

The signals LOC and LOCn are also fed to the gate terminals, respectively, of the N-type and P-type transistors that constitute the pass transistor 46.

The signal output from the tristate structure 12 is the signal for access to the data bus 3 by the local signal sources $5_i$ (where i=1 . . . n; in the case of FIG. 3, n=2) and is referenced as DATA-bus<x>.

Figure 11:
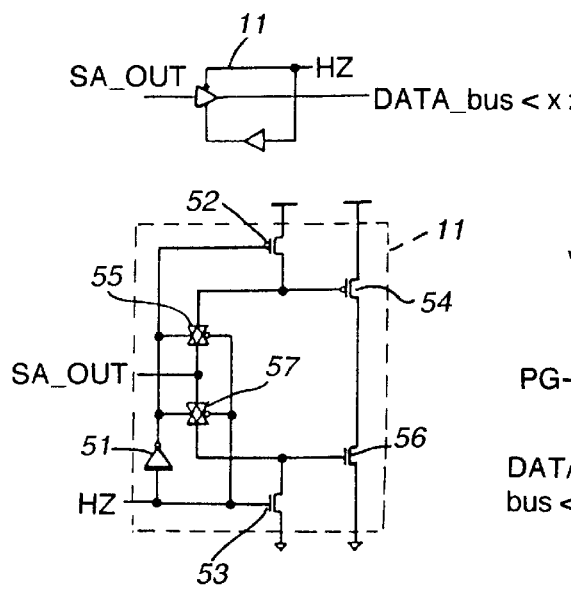
FIG. 11 is a circuit diagram of a portion of the architecture of the memory device according to the invention, shown in FIGS. 1 to 3.

FIG. 11 is a circuit diagram of the tristate structure 11 for access to the data bus 3 by the sense amplifier 2.

The number of tristate circuits shown in FIG. 11 is equal to the number of the sense amplifiers 2 of the memory matrix 1.

The signal input to the sense amplifier 2 (actually, as mentioned, a plurality of sense amplifiers) is a bus referenced by SA-OUT, i.e, the set of the output signals of the sense amplifiers 2. In practice, the output signal of each sense amplifier 2 is fed into the corresponding tristate circuit 11. The figures, for the sake of simplicity, show a single sense amplifier 2 instead of the plurality of said amplifiers and a bus SA-OUT for the plurality of signals as output from the sense amplifiers.

In FIG. 11, two signals are used as input to each tristate circuit 11: the signal HZ generated by the circuit of FIG. 5, and the signal SA-OUT, which is the output of the corresponding sense amplifier.

The signal HZ is fed into an inverter 51 to be fed to the gate terminals of a P-type transistor 52 and of an N-type transistor 53. The drain terminal of the transistor 52 is connected to the supply voltage, whereas its source terminal is connected to the gate terminal of a P-type transistor 54 and to a pass transistor 55.

The source terminal of the transistor 53 is connected to the ground, whereas its drain terminal is connected to the gate terminal of an N-type transistor 56 and to a pass transistor 57.

The drain terminal of the transistor 54 is connected to the supply voltage, whereas its source terminal is connected to the drain terminal of the transistor 56.

The source terminal of the transistor 56 is connected to the ground.

The signal SA-OUT is fed to the pass transistors 55 and 57, as shown in FIG. 11.

Figure 12:
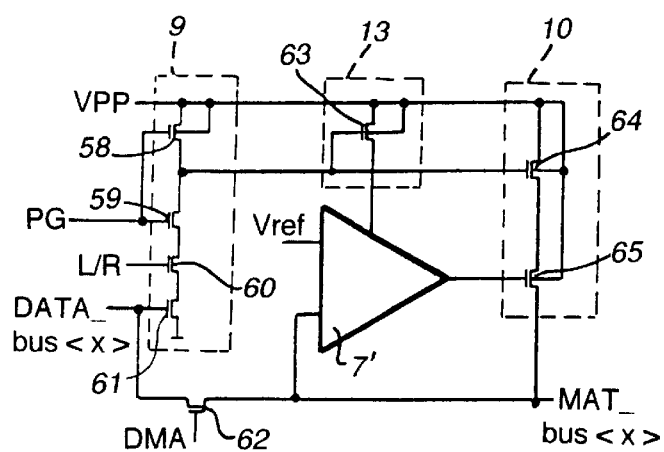
FIG. 12 is a circuit diagram of a portion of the architecture of the memory device according to the invention, shown in FIGS. 1 to 3.

FIG. 12 shows the circuital execution of the switches 10 and 13, of the NAND logic gate 9, and of the DMA, shown in FIGS. 2 and 3.

In particular, the programming means 7' receives as input a reference voltage signal $V_{ref}$, the signal DMA, and the bus MAT-bus<x>.

The NAND logic gate 9 is implemented by means of four transistors 58, 59, 60, and 61, in which the transistor 58 is of the P type, whereas the other ones are of the N type. The transistors, connected as shown in the figure, receives in input the signal PG (which is fed to the gate terminals of the transistors 58 and 59), the signal L/R (which is fed to the gate terminal of the transistor 60), and the signal DATA-bus<x>(which is fed to the gate terminal of the transistor 61).

DMA enabling is provided by means of a transistor 62 of the N type, whose gate terminal receives the signal DMA.

The switch 13 is provided by a P-type transistor 63 that is connected as shown in the figure, whereas the switch 10 is implemented by two P-type transistors 64 and 65 that are connected as shown in the figure.

With reference to the above figures, the operation of the memory device according to the invention is as follows.

The architecture of the device according to the present invention provides a data transmission protocol, by virtue of the timer means 8, which when in sync with each reading and programming cycle allows multiple uses for the data bus 3 in a same reading cycle.

During a first step of the reading cycle, when the data bus is not in use due to the unavailability of the data for reading, the data bus 3 is used to transmit redundancy signals ROC (Redundancy Output Code) or MC signals (device manufacturer code) and DC (Device Code) signals or signals related to contingent configurations or to instructions (CONF and IST).

Therefore, all the lines that are required to supply data during the first step are grouped and organized to communicate with the internal bus 3 through the local signal source structures 5' and 5", which achieve their data transmission functions in a cyclical manner.

The same units can also be monitored during the rest of the cycle as well, by acting on the control signal USRn-CNT=0.

The interval dedicated to this first step is paced by the timing signal SEND, which is correlated to each pulse of the signal ATD (the respective inverted signals SENDn and ATDn are shown in FIG. 4) and is independent of any subsequent activity.

In the second step, the data bus 3 constitutes the normal data transmission channel for the ordinary activities of the memory device (reading the data and programming the memory).

Every time a data item that originates from a source that is external to the memory matrix 1 is requested, the timer means 8, more clearly defined in FIGS. 5–8, which is constituted by a self-activation logic structure, allows enablement of the path for connecting the external source to the data bus 3, in the case of the local signal sources 5$_i$, after the transmission of the data on the local bus 6.

The signals that control the data stream over the data bus 3 are, as shown, exclusive and in sync with events that are paced by the timer means 8 and have the purpose of enabling access of the external sources to the data bus 3.

In inactive conditions, the data bus 3 is assigned to the sense amplifiers 2 when the signal HZ is low.

With reference to FIG. 4, when the signal EQ (equalization) goes from high to low, and therefore the signal SENDn has first passed from low to high (i.e., the step for sending the signals ROC, CONF, and IST during the inactivity step of the data bus 3 with regard to reading the data from the memory matrix 1 has ended), the signal HZ goes from high to low, and during this period data is read from the memory matrix 1 to the data bus 3.

This situation can be observed in FIG. 11, with the input of the signals HZ and SA-OUT (output of the sense amplifiers 2) in the tristate circuit 11 that enables access of the tristate circuits to the data bus 3. In this manner, the connecting path between MAT-BUS and the data bus 3 is completed.

This situation occurs whenever HZ is low, simultaneously with the signal EQ, which becomes low. The correlation of the signal HZ with the signals SENDn, EQ, ATDn, and HZ-CNT (control signal) is shown in the circuit of FIG. 5.

During this step, the signal SENDn is high, the signal PG is low (we are not in the step for programming the memory 1), the signal CHK, the signal LOC, and the signal USR are low (the local signal sources are not communicating with the data bus 3), and therefore the local signal sources are in a high-impedance condition, i.e., in a condition in which access to the data bus 3 is denied.

The states of the signals 16, 17, 18, 19, and 20 during this step may be read on the chart of FIG. 4.

When the signal EQ goes from low to high, the signal HZ becomes high, the signal SENDn becomes low at a burst variation of ATDn, the signal USR becomes high, CHK remains low, LOC becomes high, and PG is always low. During this step, the connecting path between the sense amplifiers 2 and the data bus 3 is blocked.

In the interval during which the signal HZ remains high, i.e., during which the data of the memory matrix 1 is not transmitted over the data bus 3, said data bus remains available for all external activities and can therefore be managed by the external sources and by the programming means 7 for programming the memory device.

Therefore, in the interval during which USR is high (i.e., when SENDn or USRn-CNT are simultaneously or individually low, see FIG. 6), the local signal source 5' accesses the data bus 3 after the data has passed along the local bus 6.

The enabling of access to the local bus 6 is provided by the signal LOC, which is high in this step (see FIG. 9). The signal LOC is generated by the logic circuit of FIG. 9, which receives the signals USRn and CHK as input. Therefore, if either USRn or CHK is low, LOC is high. Whenever a local resource is stimulated, access to the data bus 3 is also allowed.

The interval in which LOC is high corresponds to the interval during which the data bus is used by the internal and external sources, which are never stimulated during a programming step, i.e., when the signal PG is high.

Therefore, if one considers the interval during which LOC is high and SENDn is low, and observing the groups of signals 16, 17, 18, 19, and 20 in FIG. 4, it is evident that several situations may occur in this interval.

For example, if the signal DC/MC is high, i.e., it is necessary to read as output the signals DC and MC, the signals are sent in the interval during which the data of the memory 1 is not being read. Therefore the signals DC and MC are transmitted over the data bus 3 together with the data ROC, CON, and IST.

Instead, in case of a high level of the programming signal PG-CNT that originates from the timer means 8' and from which the signal PG, which is high, originates by means of the circuit of FIG. 8, the programming step is enabled. During this step, the programming means 7 is under the control of the data bus 3, guided by the I/O means 4, which thus decides which "word" to be programmed in the memory 1.

This programming step is represented by the group of signals 17 in FIG. 4.

If instead the signal CHK-CNT goes from low to high and therefore CHK also goes from low to high, in the interval during which LOC is high, signals are transmitted over the data bus 3 by the local signal source 5" after passing through the local bus 6.

Again, when the signal USRn-CNT switches from high to low, the local signal source 5' gains access to the data bus 3 after the transmission of the data on the local bus 6. In this step, too, the signals DC and MC are still sent, but they are not requested during reading in output and therefore are not considered.

Finally, when the DMA signal goes from low to high, i.e., when direct access to the memory is requested for particular requirements related to checking the content of the individual cells of the memory, the data of the memory are transferred toward the output over the data bus. In this case, the signals USR and CHK are low to avoid overlaps in access to the data bus 3.

In FIG. 4, with reference to the groups of signals 16, 17, 18, 19, and 20, the signal designated by LOCAL-IN indicates the signal that is transmitted over the local bus 6.

In practice it has been observed that the memory device according to the present invention fully achieves the intended aim, since it provides for an architecture that implements a bidirectional data bus 3 that is used for all the transmission, programming, and testing functions of the memory.

When the data of the memory matrix 1 is not yet ready for reading, the normal reading cycle of the memory is used for a series of operations related to the memory, by means of access to the data bus by a plurality of external and internal sources.

The bidirectionality of the data bus 3 allows communication, even indirectly, with external sources that can be set to a high-impedance condition, so as to not access the data bus when another structure is in turn accessing the bus.

The external sources are then activated individually, within the same reading cycle of the memory, preventing any kind of data bus access conflict. Accordingly, one obtains a sorting of the data streams and of the controls between the various memory blocks, which is a consequence of the rationalization of the transmission lines of the memory device.

Every exchange of data between outside of the memory and inside or vice versa, memory monitoring, and testing activities are all performed by means of the single data bus 3, achieving the result of eliminating dedicated transmission lines that occupy space and complicate the architecture of the device.

The device thus conceived is susceptible to numerous modifications and variations, all of which are within the scope of the inventive concept.

Thus, for example, data transfer over the local bus 6 can be bidirectional, as occurs on the data bus 3.

Furthermore, a plurality of tristate structures $14_i$ (where i=1 . . . n) for enabling access of the local sources $5_i$ to the local bus 6 can communicate with the local bus 6.

The above-mentioned architecture can also be adapted to the case in which the memory matrix 1 is divided into blocks and is not a single block as shown in FIGS. 1 to 3. In this case, the signal L/R for selecting the memory block involved in a given event becomes crucially important.

Finally, all the details may be replaced with other technically equivalent elements.

In practice, the materials employed, so long as they are compatible with the specific use, as well as the dimensions, may be any according to the requirements and the state of the art.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A non-volatile memory device, comprising:

at least one bidirectional internal bus that extends from one end of the memory device to another;

one or more source structures that exist externally and internally to said memory device;

timer means, said timer means being adapted to time-control independent and exclusive access of said one or more source structures, within a same memory cycle, to said at least one bidirectional internal bus for transmission of data, controls and functions, from one end of the memory device to another over said at least one bidirectional internal bus; and means for enabling and disabling, under control of the timing means, independent and exclusive access of said one or more source structures to said at least one bidirectional internal bus, for transmission of signals over said at least one bidirectional internal bus, within a same reading cycle of the memory device.

2. The memory device according to claim 1, further comprising:

at least one local bus adapted to interface said one or more source structures, which exist externally to said memory device, to said at least one bidirectional internal bus.

3. The memory device according to claim 2, wherein said one or more enabling/disabling means further comprises:

source structure enabling/disabling means adapted to allow access of said one or more source structures, which exist externally to said memory device, to said at least one local bus, said access being time-controlled by said timer means, independently and exclusively.

4. The memory device according to claim 3, wherein a number of said source structure enabling/disabling means adapted to allow access to said at least one local bus is equal to a number of said external source structures.

5. The memory device according to claim 3, further comprising local bus enabling/disabling means adapted to interface said at least one local bus with said at least one bidirectional internal bus to enable transfer of data, controls, and functions to said at least one bidirectional internal bus.

6. The memory device according to claim 5, wherein said local bus enabling/disabling means, interposed between said at least one local bus and said at least one bidirectional internal bus, and receives as input a driving signal which originates from said timer means and also receives as input signals to be transmitted which originate from said at least one local bus, said driving signal being adapted to set said local bus enabling/disabling means to a low/high impedance condition respectively, based on said driving signal.

7. The memory device according to claim 1, wherein said timer means receives as input control signals for said memory device, said control signals being time-controlled and synchronized so as to allow mutually exclusive access of said one or more source structures to said at least one bidirectional internal bus during a same memory reading cycle.

8. The memory device according to claim 2, wherein said one or more enabling/disabling means adapted to allow/deny access of one or more external source structures to said at least one local bus receives as input a driving signal that is time-controlled by said timer means and also receives signals that originate from said one or more external source structures.

9. The memory device according to claim 1, further comprising sense amplifier enabling/disabling means for enabling/disabling access to the at least one bidirectional internal bus by the data of the memory device from at least one sense amplifier, said sense amplifier enabling/disabling means being interposed between sense amplifiers of said memory device and said at least one bidirectional internal bus.

10. The memory device according to claim 9, wherein said sense amplifier enabling/disabling means receives as input a signal for disabling/enabling a memory data reading path and also receives the data from the at least one sense amplifier.

11. The memory device according to claim 1, further comprising programming means connected between said at least one bidirectional internal bus and a memory in said memory device.

12. The memory device according to claim 1, further comprising input/output means which interacts with said at least one bidirectional internal bus.

13. The memory device according to claim 1, wherein said one or more enabling/disabling means are tristate circuits.

14. The memory device according to claim 2, wherein said at least one local bus is unidirectional.

15. The memory device according to claim 2, wherein said at least one local bus is bidirectional.

16. The memory device according to claim 11, wherein said programming means for said memory further comprises:

logic means, which receives as input a programming signal and data carried by the at least one bidirectional internal bus;

means for adjusting programming of said memory, coupled to said at least one bidirectional internal bus and receives as input a reference signal;

an output of said means for adjusting is sent to said at least one bidirectional internal bus in a manner that is time-controlled by said timer means.

17. The memory device according to claim 16, wherein said logic means receives as input a signal that indicates a portion of the memory that is to be programmed.

18. The memory device according to claim 1, further comprising means for direct access to the memory, adapted to directly access said memory by accessing said at least one bidirectional internal bus.

19. A method for transmitting signals in a memory device comprising at least one bidirectional internal bus, with one or more external and internal source structures that are adapted to access said at least one bidirectional internal bus with a timer means, comprising the steps of:

detecting an address change signal of said memory device;

allowing mutually exclusive access using the timer means of each one of said one or more external and internal source structures to said at least one bidirectional internal bus, wherein said one or more external and internal source structures transmits data on said internal bus during a step of a memory reading cycle in which data of the memory device are not yet present for reading; and disabling, using the timer means, the independent and exclusive access of said one or more external and internal source structures to said at least one bidirectional internal bus to enable reading of data of said memory device during the memory reading cycle of said memory device.

20. The method according to claim 19, wherein said step of allowing mutually exclusive access further comprises the steps of:

time-controlling, by virtue of said timer means, the access of each one of said external and internal sources to at least one local bus;

time-controlling, by virtue of said timer means, the access of said at least one local bus to said at least one bidirectional internal bus.

21. The method according to claim 19, further comprising a step of programming said memory during the normal memory reading cycle of said memory.

22. The method according to claim 19, further comprising the step of directly accessing said memory within the normal memory reading cycle of said memory.

23. The method according to claim 19, wherein the step of allowing mutually exclusive access includes a step of transmission of signals that originate from said one or more external and internal source structures, wherein said transmission occurs over said at least one bidirectional internal bus within a normal cycle for reading said memory.

24. A method for controlling access by one or more source structures to a bidirectional data bus of a memory device, during a period of time of a memory cycle defined by a timer, comprising the steps of:

(a) reading data on the data bus during a reading period of time of the memory cycle using one of said one or more source structures;

(b) transmitting data on the data bus during an inactive period of time of the memory cycle, when the data bus is not used for reading data using one of said one or more source structures; and (c) controlling the steps of reading and transmitting according to the timer.

25. The method of claim 24, wherein the step of reading data further comprises the steps of:

(a.1) denying access to the data bus to external sources of the memory device; and (a.2) enabling access to reading circuits for reading data on the data bus.

26. The method of claim 24, wherein the step (b) of transmitting data on the data bus further comprises the steps of:

(b.1) detecting when data for a memory matrix of the memory device is available from at least one of a plurality of external sources;

(b.2) denying access to the data bus to memory read circuits;

(b.3) enabling access to the data bus to the at least one of a plurality of external sources; and (b.4) transmitting data from the at least one of a plurality of external signal sources to the data bus during the inactive period of time of the memory cycle, when the data bus is not used for reading data.

27. The method of claim 24, further comprising the step of:

(c) programming the memory during a programming period of time of the memory cycle, when the data bus is not used for transmitting and reading data.

28. The method of claim 27, wherein the step of programming the memory further comprises the steps of:

(c.1) detecting when data for a memory matrix of the memory device is available from at least one input/output means;

(c.2) denying access to the data bus from reading circuits and external sources;

(c.3) enabling access to the data bus to the at least one input/output means via a programming means; and (c.4) transmitting data from the at least one input/output means via the programming means to the data bus.

29. The method of claim 24, wherein step (b) further comprises the step of (b.1) generating timing signals for pacing the transmitting data step, to allow mutually exclusive access by multiple signal sources to the data bus during various portions of the memory cycle.

30. The method of claim 24, wherein the step of transmitting data on the data bus further comprises the steps of:

(b.1) detecting when a direct memory access to the memory is requested by a direct memory access requesting source;

(b.2) denying access to the data bus for reading circuits and external sources and programming means;

(b.3) enabling access to the data bus to the direct memory access requesting source; and (b.4) transmitting data from the memory to or from the direct memory access requesting device over the data bus.

31. A mechanism for distributing bus access in a memory device, comprising:

a memory;

at least one signal source;

a timer means;

at least one bidirectional data bus; and at least one source switching means, controlled by the timer means, for coupling the at least one signal source and the memory to the at least one bidirectional data bus;

wherein the at least one source switching means permits mutually exclusive access to the at least one bidirectional data bus by the memory during a reading portion of memory cycle and by the at least one signal source during an inactive portion of the memory cycle of the memory.

32. The mechanism of claim 31, wherein the at least one source switching means permits exclusive access to the at least one bidirectional data bus by the memory and an input/output means, during a data memory access portion of the memory cycle of the memory.

33. The mechanism of claim 31, wherein the at least one source switching means permits exclusive access to the at least one bidirectional data bus by the at least one signal source during a non-data memory access portion of the reading portion of the memory cycle of the memory.

34. The mechanism of claim 31, wherein the timer means is constructed and arranged to provide timing signals to each of the at least one signal source, the timing signals controlling mutually exclusive access to the bidirectional data bus by the at least one signal source during varying portions of time during the memory cycle.

35. The mechanism of claim 31, further comprising:

at least one local data bus, wherein certain of the at least one signal source are designated as external signal sources and are externally located in relation to the memory device and are coupled to the at least one local data bus; and at least one external source switching mechanism, controlled by the timer means, for coupling the at least one local bus to the at least one bidirectional data bus, thus allowing coupling of one of the external signal sources though the at least one local data bus to the at least one bidirectional data bus, during a non-data memory access portion of the memory cycle of the memory.

36. The mechanism of claim 31, further comprising:

a programming means, coupled between the memory and the at least one bidirectional data bus by one of the at least one source switching means designated as a programming source switching means;

wherein the programming source switching means receives a signal from the timer means to allow exclusive access to the bidirectional data bus by the programming means.

37. The mechanism of claim 31, further comprising:

at least one sense amplifier, coupled between the memory and the at least one bidirectional data bus by at least one of the at least one source switching means designated as a read-path source switching means;

wherein the read-path source switching means receives a signal from the timer means to allow exclusive access to the bidirectional data bus by the sense amplifier during a reading portion of the memory cycle.

38. The mechanism of claim 31, wherein the timer means further comprises:

a timing signal generation means, for producing a plurality of timing signals having states, wherein each of the plurality of timing signals is output to a respective one of the at least one source switching means, and for coordinating the states of the plurality of timing signals to enable and disable operational access of the at least one signal source to the at least one bidirectional data bus, such that the operational access is exclusive for any one of the at least one signal source, during a portion of the memory cycle of the memory device.

* * * * *